United States Patent [19]

Takata et al.

[11] Patent Number: 4,565,960
[45] Date of Patent: Jan. 21, 1986

[54] POWER SUPPLY SWITCHING CIRCUIT

[75] Inventors: Akira Takata; Shigeki Matsuoka, both of Toyonaka, Japan

[73] Assignee: Ricoh Company, Ltd., Tokyo, Japan

[21] Appl. No.: 629,672

[22] Filed: Jul. 11, 1984

[30] Foreign Application Priority Data

Jul. 14, 1983 [JP] Japan ................................ 58-126919

[51] Int. Cl.$^4$ ................................................ G05F 3/20
[52] U.S. Cl. .................................... 323/317; 323/351; 307/297; 307/304
[58] Field of Search ............... 323/313, 314, 315, 316, 323/317, 351; 307/296 R, 297, 304; 365/226, 229

[56] References Cited

U.S. PATENT DOCUMENTS 4,423,492 12/1983 Yoshida ................................ 307/297
4,428,071 1/1984 Wilmsmeyer ........................ 307/297

Primary Examiner—Peter S. Wong
Assistant Examiner—Judson Jones
Attorney, Agent, or Firm—Cooper, Dunham, Clark, Griffin & Moran

[57] ABSTRACT

A power supply switching circuit for supplying a pair of power supply voltages different in level, such as programming voltage $V_{pp}$ and reference voltage $V_{cc}$, selectively is provided. The circuit includes a plurality of P-channel and N-channel MOS transistors which are appropriately connected such that no leakage or reverse current is produced even if the voltage at the $V_{pp}$ terminal becomes lower than $V_{cc}$.

12 Claims, 7 Drawing Figures

POWER SUPPLY SWITCHING CIRCUIT

BACKGROUND OF THE INVENTION

1. Field of the Invention

This invention generally relates to a semiconductor circuit and particularly to a power supply switching circuit suitable for use in a device which requires a high supply voltage only during programming, such as an erasable programmable read only memory (EPROM) and an electrically erasable programmable read only memory (EEPROM).

2. Description of the Prior Art

In EPROMs and EEPROMs, a high voltage $V_{pp}$ of 20–21 V is typically required during programming as an internal supply voltage and a voltage $V_{cc}$ of typically 5 V is required as an internal supply voltage during read out operation. A $V_{pp}$ pin provided as one of the terminals of a packaged semiconductor device, such as an EPROM and EEPROM, was first used exclusively for application of $V_{pp}$ voltage to be used for programming and it was not used for application of a signal having other voltage levels. Moreover, the EPROM ordinarily had an N-channel MOS (Metal-Oxide-Semiconductor) structure and thus its internal power supply switching circuit was also constructed by N-channel MOS transistors. However, with an improvement in density and an increase of memory capacity, there has recently been developed an EPROM having a CMOS (Complementary MOS) structure so as to reduce the amount of power consumption. In order to prevent the number of pins from increasing due to such an increase in memory capacity, it has come to use the same single pin for the application of programming voltage $V_{pp}$ and mode control signal, which is called $V_{pp}$/READ pin. During programming or write operation, high voltage $V_{pp}$ is applied to the $V_{pp}$/READ pin; on the other hand, during read out operation, a mode control signal of 0–5 V is applied to this pin. With the adoption of CMOS structure, an internal power supply switching circuit must also be constructed in the form of CMOS structure.

FIG. 1 illustrates a prior art power supply switching circuit having a CMOS structure. As shown, the circuit includes an input terminal 11 to which a supply voltage of $V_{cc}$ is applied. The terminal 11 is connected to a drain electrode of N-channel enhancement transistor 20. The circuit includes another input terminal 12 for receiving another supply voltage of $V_{pp}$. The terminal 12 is connected to a drain electrode of N-channel enhancement transistor 19. The source electrodes of transistors 19 and 20 are commonly connected to an output terminal 14. The circuit of FIG. 1 includes a further input terminal 13 to which a power supply switching control signal $\overline{PRG}$ is applied. This terminal 13 is connected to a gate electrode of transistor 20 which is thus turned on if $\overline{PRG}$ signal is high thereby causing the voltage level at the terminal 14 to be $V_{cc}'$. On the other hand, the terminal 13 is also connected to a gate electrode of N-channel transistor 18 through a reverse current preventing transistor 15 and a CMOS inverter comprised of a pair of P-channel and N-channel transistors 17 and 18, and, thus, if $\overline{PRG}$ signal is low, the transistor 17 is turned on thereby causing the gate voltage of transistor 19 to be $V_{pp}$, so that the transistor 19 is also turned on to set the voltage level at the terminal $V_{pp}$ to be $V_{pp}'$.

The CMOS inverter is comprised by the transistors 17 and 18 which are series-connected, and the transistor 17 has its source electrode connected to the $V_{pp}$ supply voltage with the source electrode of transistor 18 connected to ground. The transistors 17 and 18 defining a CMOS inverter have their gate electrodes commonly connected to the source electrode of N-channel transistor 15 and also to the drain electrode of P-channel transistor 16. The transistor 16 has its source electrode connected to receive the $V_{pp}$ supply voltage and its gate electrode connected to the drain electrode of each of transistors 17 and 18. Thus, if $\overline{PRG}$ signal is high, the voltage at the gate electrode of each of the transistors 17 and 18 is set at $V_{pp}$ thereby causing the transistor 17 to be turned off and the transistor 18 to be turned on. That is, the voltage at the gate electrode of transistor 19 is set at 0 V to have the transistor 19 turned off.

The transistor 15 has its source electrode connected to the input terminal 13 and its gate electrode connected to receive the supply voltage $V_{cc}$, and it serves to prevent a reverse current, corresponding to $V_{cc}$ level or more, from being supplied to the terminal 13. The above-described circuit is typically constructed on a P-conductivity type substrate, which is to be connected to ground while operation, using the well-known CMOS process. Thus, the voltage at the substrate of N-channel transistors 15, 18, 19 and 20 is at ground level. On the other hand, the P-channel transistors 16 and 17 are formed in an N-well and the substrate voltage of these transistors 16 and 17 is set at $V_{pp}$ by having the source electrode connected to the substrate in each of these transistors 16 and 17.

In the circuit of FIG. 1, output voltages at the output terminal 14 may be switched by controlling the conditions of transistors 19 and 20 depending on the state of $\overline{PRG}$ signal. However, the output voltage from each of the transistors 20 and 19 becomes reduced from $V_{cc}$ and $V_{pp}$ by the amount of threshold voltage drop. That is, if $\overline{PRG}$ signal is high, the voltages at the gate and drain electrodes of transistor 20 are both at $V_{cc}$ and its source voltage $V_{cc}'$ as an output voltage becomes $V_{cc}' = V_{cc} - V_{T1}$, where $V_{T1}$ is a threshold voltage of transistor 20. On the other hand, if $\overline{PRG}$ signal is low, the gate and drain voltages of transistor 19 are both at $V_{pp}$ so that its source voltage $V_{pp}'$ as an output voltage becomes $V_{pp}' = V_{pp} - V_{T2}$, where $V_{T2}$ is a threshold voltage of transistor 19. Furthermore, since the substrates of transistors 19 and 20 are connected to ground, the threshold voltages $V_{T1}$ and $V_{T2}$ of these transistors contain the so-called body effect components $V_{T1}$ and $V_{T2}$. Since these body effect components increase more as the output voltage becomes higher, so that the effects of voltage drop, in particular, at the transistor 19 which carries out switching of high voltage $V_{pp}$ cannot be neglected.

FIG. 2 shows another prior art circuit directed to prevent the occurrence of a voltage drop in output voltage as described above. As shown, the circuit of FIG. 2 is constructed by substituting the transistor 19 of FIG. 1 with a P-channel transistor 19' whose source electrode is connected to the substrate and to the input terminal 12 and whose drain electrode is connected to the output terminal 14 with the gate electrode connected to the drain electrode of transistor 17. The circuit of FIG. 2 includes an input terminal 13' to which $\overline{PRG}$ signal is applied. In such a structure, it is true that a voltage drop may be prevented from occurring; however, if 0 V is applied to the terminal 12 as a mode control signal with the $\overline{PRG}$ signal being low (during read out operation), a forward bias is established between the drain electrode and the N-well substrate of P-channel transistor 19' because the voltage at the drain electrode of transistor 19' becomes $V_{cc}$ even though the source electrode and N-well susbtrate of transistor 19' are set at 0 V, so that there appears a problem of current flow toward the terminal 12.

SUMMARY OF THE INVENTION

It is therefore a primary object of the present invention to obviate the disadvantages of the prior art as described above and to provide an improved power supply switching circuit.

Another object of the present invention is to provide a semiconductor power supply switching circuit capable of supplying two or more supply voltages different in level selectively without producing a voltage drop.

A further object of the present invention is to provide a semiconductor power supply switching circuit capable of supplying two or more supply voltages different in level selectively without producing leakage current.

A still further object of the present invention is to provide a semiconductor device having at least one pin which is used for application of two or more voltages different in level selectively.

Other objects, advantages and novel features of the present invention will become apparent from the following detailed description of the invention when considered in conjunction with the accompanying drawings.

DESCRIPTION OF THE PREFERRED EMBODIMENTS

Figure 3:
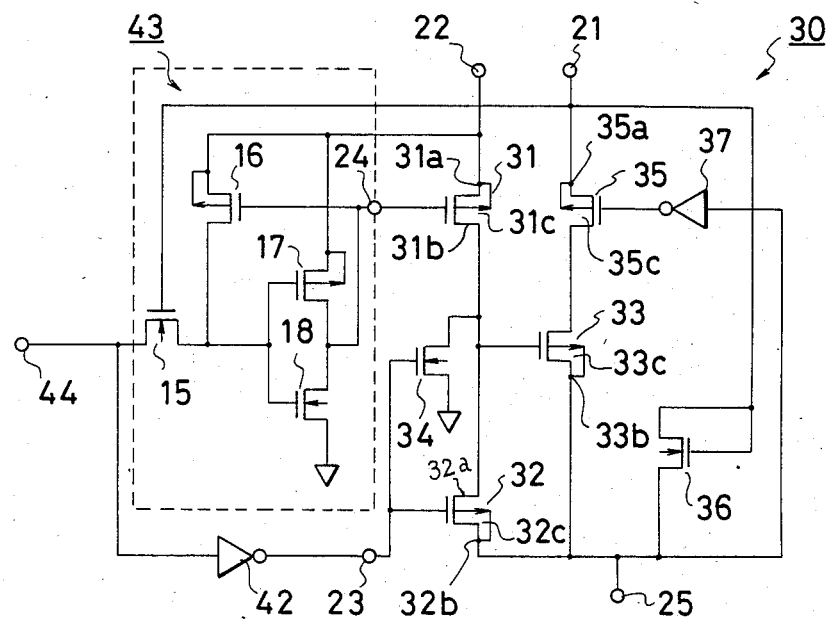
FIGS. 3 through 6 are circuit diagrams showing various embodiments of the present invention when applied to a programming voltage switching circuit of EPROM.

Referring now to FIG. 3, there is shown a power supply voltage switching circuit embodying the present invention, which is constructed in the form of CMOS structure and which includes separate pins for programming voltage $V_{pp}$ and mode control signal PRG. Thus, with this structure, switching between internal power supply voltages is carried out by the mode control signal PRG under the condition that high voltage $V_{pp}$ is being applied to the $V_{pp}$ pin. It is to be noted that a programming mode is established by the PRG signal being high and a read out mode is established by the PRG signal being low. In the circuit of FIG. 3, there is provided a mode control signal input terminal 44 which is connected to a mode control signal pin (not shown) and which is connected to a switching signal input terminal 23 of power supply switching circuit 30 through an inverter 42 and also to another switching signal input terminal 24 through a composite inverter circuit 43 indicated by the dotted line.

Figure 1:
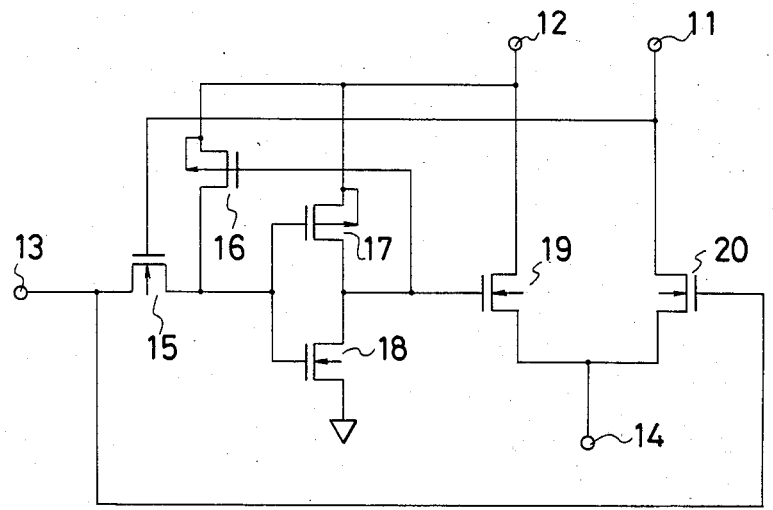
FIGS. 1 and 2 are circuit diagrams showing typical prior art power supply switching circuits.
Figure 2:
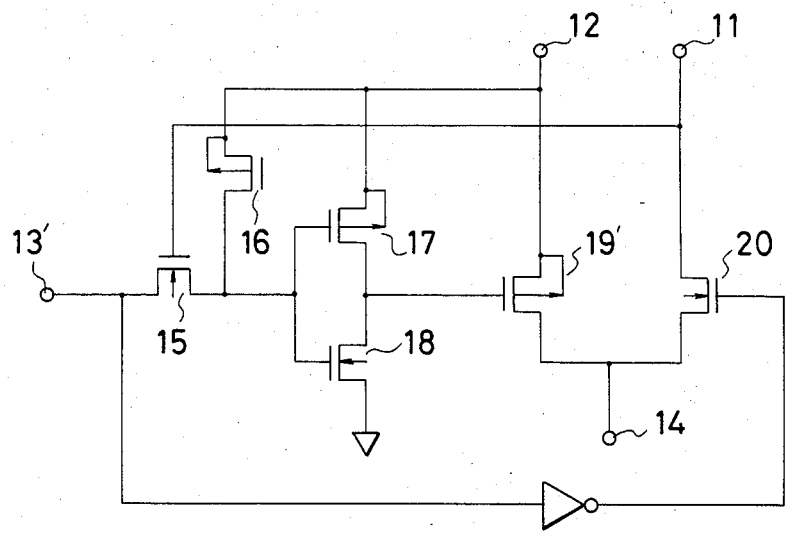

If the input signal PRG applied to the mode control signal input terminal 44 is high, the low state is established at the terminals 23 and 24 so that the power supply switching circuit 30 supplies $V_{pp}$ at its output terminal 25. On the other hand, if the PRG signal applied to the terminal 44 is low, then a power supply voltage of $V_{cc}$ is supplied to the output terminal 25. It is to be noted that with respect to the elements of the composite inverter circuit 43 in FIG. 3, those elements which are identical to those shown in FIG. 1 are indicated by the identical numerals. Thus, the transistor 15 is provided to prevent reverse current and the transistor 16 is provided to turn the transistor 18 off, which defines, together with the transistor 17, a CMOS inverter.

The power supply switching circuit 30 includes a $V_{cc}$ power supply terminal 21 and a $V_{pp}$ power supply terminal 22 which are electrically connected to a $V_{cc}$ pin and a $V_{pp}$ pin (not shown) of EPROM, respectively. Between the $V_{cc}$ terminal 21 and output terminal 25 is provided a pair of P-channel transistors 35 and 33 as connected in series, and similarly between the $V_{pp}$ terminal 22 and output terminal 25 is provided a pair of P-channel transistors 31 and 32 as connected in series. Since the EPROM of the present embodiment is constructed in a substrate of P conductivity type, the P-channel transistors 31, 32, 33 and 35 mentioned above are formed in N-wells. N-wells 31c and 35c of transistors 31 and 35 are electrically connected to $V_{pp}$ power supply terminal 22 and $V_{cc}$ power supply terminal 21, respectively, through their respective source electrodes 31a and 35a. Moreover, the transistors 32 and 33 have their N-wells 32c and 33c commonly connected to the output terminal 25 through their respective drain electrodes 32b and 33b.

The transistor 31 has its gate electrode connected to the terminal 24 and the transistor 32 has its gate electrode connected to the terminal 23, which is also connected to the gate electrode of N-channel transistor 34. The transistor 31 has its drain electrode 31b connected to the source electrode 32a of transistor 32, to the drain electrode of transistor 34 and also to the gate electrode of transistor 33. There is also provided an N-channel transistor 36 which has its drain and gate electrodes connected to the $V_{cc}$ power supply terminal 21 and its source electrode connected not only to the output terminal 25 but also to an inverter 37 at its input terminal. The inverter 37 has its output terminal connected to the gate electrode of transistor 35.

Now, the operation of the power supply switching circuit shown in FIG. 3 will be described. In the first place, the state of each of the transistors and the voltage level at each of the terminals in each mode of operation will be shown in Table I below.

TABLE I

| Elements | 23(24) | 31 | 31b | 32 | 34 | 33 | 35 | 36 | 25 |
|---|---|---|---|---|---|---|---|---|---|
| WRITE | low | on | $V_{pp}$ | on | off | off | on | off | $V_{pp}$ |
| READ | high | off | on | off | on | on | on | off | $V_{cc}$ |

During write (programming) mode, the terminals 23 and 24 are maintained low thereby causing the transistors 31 and 32 to be turned on and the transistor 34 to be turned off, so that the voltage at the drain electrode 31b of transistor 31 becomes $V_{pp}$, which causes the transistor 33 to be turned off to supply the power supply voltage $V_{pp}$ to the output terminal 25. In this case, since a voltage difference between the gate and source electrodes of transistor 31 remain unchanged at $V_{pp}$, there is produced no threshold voltage drop at the transistor 31.

On the other hand, a voltage difference between the gate and source electrodes of transistor 32 gradually increases until $V_{pp}$ is reached passing beyond the threshold voltage, there is produced no threshold voltage drop at the transistor 32, either. Moreover, since the transistors 31 and 32 have their N-wells 31c and 32c connected to their source electrode 31a and drain electrode 32b, respectively, the body effect does not come into play.

During read mode of operation, the terminals 23 and 24 are maintained high to have the transistors 31 and 32 turned off and the transistor 34 turned on, so that the voltage at the drain electrode 31b of transistor 31 is at 0 V level, which causes the transistor 33 to be turned on thereby permitting the power supply voltage $V_{cc}$ to appear at the output terminal 25. Also in this case, a voltage difference between the gate and source electrodes at the transistors 33 and 35 remain unchanged at $V_{cc}$, there is produced no threshold voltage drop at the transistors 33 and 35. Furthermore, the transistors 33 and 35 have their N-wells 33c and 35c connected to the drain electrode 33b and source electrode 35a, respectively, so that these transistors 33 and 35 are free of the so-called body effect.

When switching from the write mode to the read mode, even if the high state is established at the terminals 23 and 24, the transistor 32 remains on until the voltage at the terminal 25 due to the remaining charge becomes lower than a voltage determined by $V_{cc}$+threshold voltage of transistor 32 while the remaining charge at the output terminal 25 flows to ground GND through the transistors 32 and 34. When the transistor 32 is turned off, the transistor 33 is turned on, so that current flows from the terminal 21 to the output terminal 25 thereby establishing the power supply voltage $V_{cc}$ at the output terminal 25. Moreover, even if 0 V is applied to the $V_{pp}$ terminal 22 during read out mode, since the transistor 32 remains off, the voltage at the drain electrode 31b of transistor 31 remains 0 V, so that there will be no reverse current flowing from the N-well 31c of transistor 31 to the $V_{pp}$ terminal 22 through the drain electrode 31b.

It is to be noted that in the circuit shown in FIG. 3, the output terminal 25 is at the low state at the time of application of power supply voltage $V_{cc}$. When the power supply voltage $V_{cc}$ is applied, current starts to flow toward the output terminal 25 through the transistor 36 thereby gradually increasing the voltage at the output terminal 25. However, since the output terminal 25 is an internal power supply terminal which has a relatively large capacity, it takes time in increasing the voltage at the output terminal 25. The inverter 37 retains the high state at its output terminal thereby maintaining the transistor 35 cut off until the voltage at the output terminal 25 reaches a predetermined level. With this structure, a charge-up operation is carried out for the output terminal 25 by the transistor 36 until the voltage at the output terminal 25 increases to a predetermined level. This is because, since the voltage at the N-well 33c of transistor 33 is unstable while the voltage at the terminal 25 is unstable, it is preferable for the transistor 33 to receive no current during this unstable time period. Such a structure allows to effectively prevent the occurrence of latch-up phenomenon.

Figure 4:
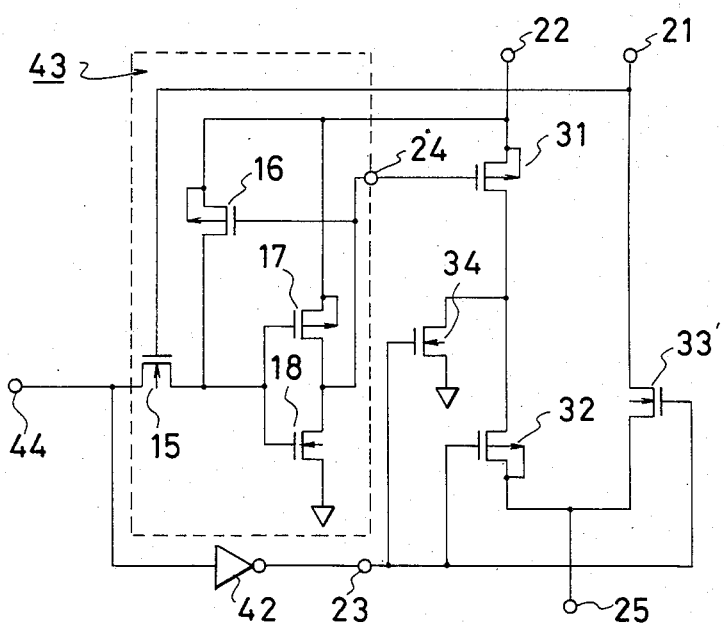

FIG. 4 illustrates another embodiment of the present invention, in which like numerals are used to indicate like elements in FIG. 3. The circuit of FIG. 4 is generally similar to the circuit of FIG. 3 excepting that use is made of an N-channel transistor 33' as a switching transistor for $V_{cc}$ in the embodiment shown in FIG. 4. As shown, in the present embodiment, the transistor 33' has its drain electrode connected to the $V_{cc}$ power supply terminal 21, its source electrode connected to the output terminal 25 and its gate electrode connected to the input terminal 23. With such a structure, if the high state is established at the terminal 23, the transistor 33' is turned on, but a voltage difference between its gate and source electrodes becomes smaller as the source voltage increases. And, since the drain voltage becomes saturated when the threshold voltage is reached, the output voltage $V_{cc}'$ supplied at the output terminal 25 is lower than the original supply voltage $V_{cc}$ by the amount of threshold voltage. Thus, the circuit of FIG. 4 is directed to the situation in which a voltage drop in the path for supplying $V_{cc}$ may be neglected while preventing the occurrence of voltage drop in the path for supplying $V_{pp}$. The circuit of FIG. 4 is also provided with the transistor 32 which serves to prevent the occurrence of reverse current even if 0 V is applied to the $V_{pp}$ terminal 22.

Figure 5:
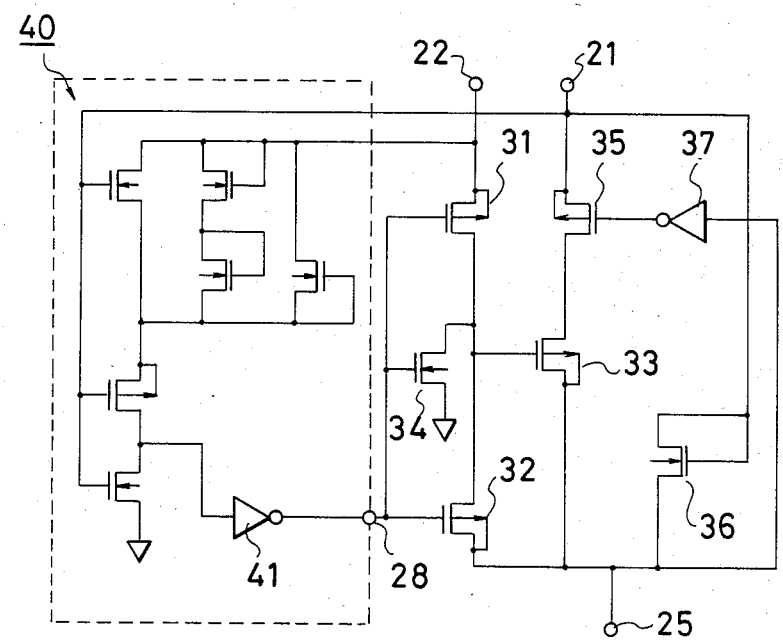
Figure 6:
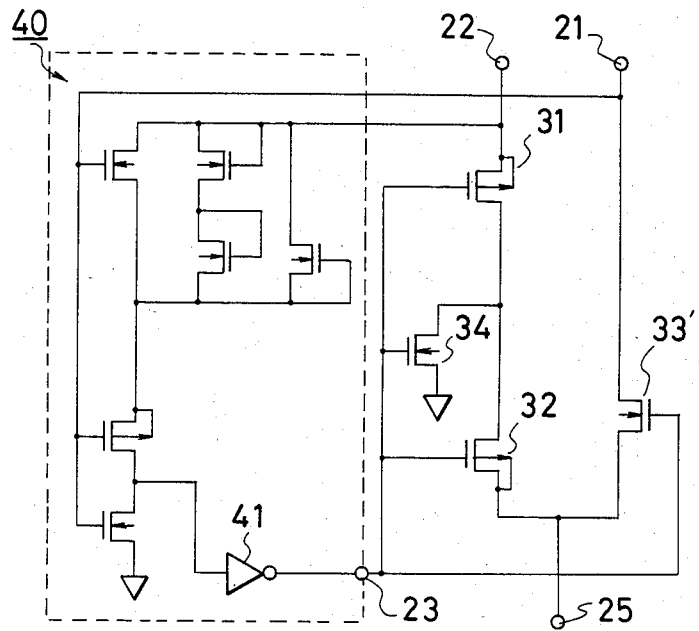
Figure 7:
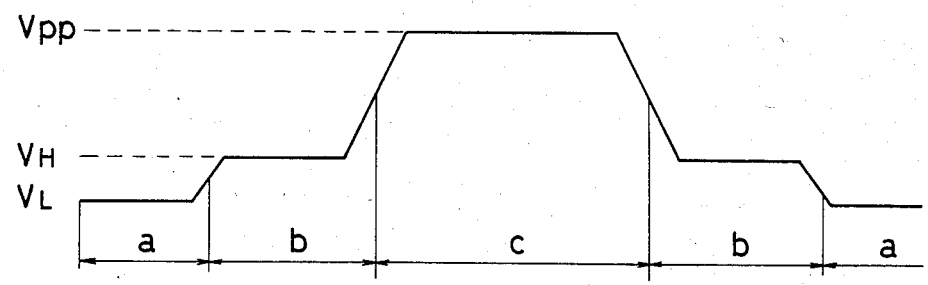
FIG. 7 is a graph showing a wave form of $V_{pp}$/READ signal.

FIGS. 5 and 6 show other embodiments of the present invention, in which the $V_{pp}$ and mode control signal pins of an EPROM having a CMOS structure are consolidated into a single pin ($V_{pp}$/READ pin). FIG. 7 is a graph showing the relation between the voltage level of $V_{pp}$/READ signal and the mode of operation. As shown, the read out mode a is established when the voltage level of $V_{pp}$/READ signal is at $V_L$, the standby mode b is established when the voltage level is at $V_H$, and the write mode c is established when the voltage level is at $V_{pp}$. It is to be noted that the voltage level between $V_L$ and $V_H$ ranges between 0 and 5 V. The circuit indicated by the dotted line in each of FIGS. 5 and 6 is a high voltage detecting circuit 40 and it detects the level of the voltage at the $V_{pp}$ power supply terminal 22 which is connected to the $V_{pp}$/READ pin. Since the high voltage detecting circuit 40 does not form part of the present invention, its detailed description will be omitted.

In either of the circuits shown in FIGS. 5 and 6, the write mode is maintained as long as power supply voltage $V_{pp}$ is applied to the terminal 22. The circuits shown in FIGS. 5 and 6 are constructed from the circuits shown in FIGS. 3 and 4, respectively, such that the terminals 23 and 24 are consolidated into a single terminal 28 which is connected to the output terminal of an inverter 41 defining the final stage of high voltage detecting circuit 40 with the omission of the composite inverter circuit 43. This is because, in the circuits shown in FIGS. 5 and 6, it is not necessary to have the transistor 31 turned off while voltage $V_{pp}$ is applied to the $V_{pp}$ terminal 22. It is to be noted that, in the circuits shown in FIGS. 5 and 6, like numerals are used to indicate like elements in the circuits shown in FIGS. 3 and 4.

As described above, in accordance with the present invention, there is provided a power supply switching circuit having a CMOS structure, which is capable of supplying two power supply voltages different in level, e.g., $V_{pp}$ and $V_{cc}$, selectively as an internal power supply voltage. Moreover, in the power supply switching circuit embodying the present invention, there will be produced no reverse or leakage current even if the voltage at the $V_{pp}$ terminal becomes lower than $V_{cc}$.

While the above provides a full and complete disclosure of the preferred embodiments of the present invention, various modifications, alternate constructions and equivalents may be employed without departing the true spirit and scope of the invention. Therefore, the above description and illustration should not be construed as limiting the scope of the invention, which is defined by the appended claims.

What is claimed is:

1. A circuit for switching between a pair of power supply voltages, comprising:
    a first terminal to which a first voltage is applied;
    a second terminal to which a second voltage larger than said first voltage is applied;
    a pair of third and fourth terminals for receiving a control signal for controlling the switching between a pair of power supply voltages, said control signal having either a high or low state;
    a fifth terminal to which a selected voltage is supplied as an output;
    a pair of first and second switching means connected in series between said second terminal and said fifth terminal, said first switching means being turned on or off depending upon the state of said control signal at said third terminal and said second switching means being turned on or off depending upon the state of said control signal at said fourth terminal;
    third switching means connected between a junction between said first and second switching means and a reference voltage, said third switching means being turned on or off depending upon the state of said control signal at said third terminal; and
    fourth switching means connected between said first terminal and said fifth terminal, said fourth switching means being turned on or off depending upon a low or high state at said junction between said first and second switching means.

2. The circuit of claim 1 further comprising a fifth switching means connected between said first terminal and said fifth terminal, said fifth switching means being turned on or off depending upon a voltage level at said first terminal.

3. The circuit of claim 2 further comprising a sixth switching means connected in series between said first terminal and said fourth switching means, said sixth switching means being turned on or off depending on a voltage level at said fifth terminal.

4. The circuit of claim 3 wherein said first, second, fourth and sixth switching means each comprise a MOS transistor of a first conductivity type, having a source electrode, a drain electrode and a gate electrode and said third and fifth switching means each comprise a MOS transistor of a second conductivity type which is opposite in polarity to said first conductivity type, having a source electrode, a drain electrode and a gate electrode.

5. The circuit of claim 4 wherein said first conductivity type is P type and said second conductivity type is N type.

6. The circuit of claim 5 wherein said reference voltage is ground voltage.

7. The circuit of claim 6 wherein said third and fourth terminals are connected in common.

8. A circuit for switching between a pair of power supply voltages, comprising:
    a first terminal to which a first voltage is applied;
    a second terminal to which a second voltage larger than said first voltage is applied;
    a pair of third and fourth terminals for receiving a control signal for controlling the switching between a pair of power supply voltages, said control signal having either a high or low state;
    a fifth terminal to which a selected voltage is supplied as an output;
    a pair of first and second switching means connected in series between said second terminal and said fifth terminal, said first switching means being turned on or off depending upon the state of said control signal at said third terminal and said second switching means being turned on or off depending upon the state of said control signal at said fourth terminal;
    third switching means connected between a junction between said first and second switching means and a reference voltage, said third switching means being turned on or off depending upon the state of said control signal at said third terminal; and
    fourth switching means connected between said first terminal and said fifth terminal, said fourth switching means being turned on or off depending upon the state of said control signal at said third terminal.

9. The circuit of claim 8 wherein said first, second and fourth switching means each comprise a MOS transistor of a first conductivity type, having a source electrode, a drain electrode and a gate electrode and said third switching means comprises a MOS transistor of a second conductivity type which is opposite in polarity to said first conductivity type, having a source electrode, a drain electrode and a gate electrode.

10. The circuit of claim 9 wherein said first conductivity type is P type and said second conductivity type is N type.

11. The circuit of claim 10 wherein said reference voltage is ground voltage.

12. The circuit of claim 11 wherein said third and fourth terminals are connected in common.

* * * * *